United States Patent
Brunner et al.

(10) Patent No.: US 7,172,975 B2
(45) Date of Patent: *Feb. 6, 2007

(54) PROCESS FOR THE WET CHEMICAL TREATMENT OF SEMICONDUCTOR WAFERS

(75) Inventors: Roland Brunner, Reut (DE); Helmut Schwenk, Burghausen (DE); Johann Zach, Pfarrkirchen (DE)

(73) Assignee: Siltronic AG, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 258 days.

(21) Appl. No.: 09/425,694

(22) Filed: Oct. 22, 1999

(65) Prior Publication Data

US 2001/0003680 A1   Jun. 14, 2001

(30) Foreign Application Priority Data

Nov. 19, 1998   (DE) ............................... 198 53 486

(51) Int. Cl.
*H01L 21/02* (2006.01)

(52) U.S. Cl. .................. 438/745; 438/750; 438/751; 438/752; 438/753; 438/734; 438/749; 438/703; 134/3; 134/25.4

(58) Field of Classification Search .............. 438/745, 438/750–753, 749, 702, 703, 734; 134/3, 134/25.4
See application file for complete search history.

(56) References Cited

U.S. PATENT DOCUMENTS 5,014,737 A * 5/1991 Berman .................. 137/334
5,593,538 A * 1/1997 Davison et al. .......... 438/747
5,803,980 A   9/1998 Pas et al.
6,132,522 A * 10/2000 Verhaverbeke et al. ....... 134/26
6,273,098 B1 * 8/2001 Wong ..................... 134/1.3

FOREIGN PATENT DOCUMENTS

| EP | 0701275 | | 3/1996 |
| EP | 0701275 | A2 * | 3/1996 |
| EP | 0731495 | | 9/1996 |
| EP | 0731498 | | 9/1996 |
| EP | 0731498 | A2 * | 9/1996 |
| EP | 0844650 | | 5/1998 |
| EP | 0859404 | | 8/1998 |

OTHER PUBLICATIONS

Abstract for JP 4-26 120 A.
Abstract [1983:45 13 999] for Proceedings of the second Int. Symp. on Cleaning Techn. in Semiconductor Device Manufacturing, Electrochem. Soc., 1992 pp. 18-25.
M. Meuris et al., Solid State Technologie, Jul. 95, p. 109.
Patent Abstracts of Japan, vol. 1996, No. 06, Jun. 28, 1996 & JP 08031837A (Mitsubishi Materials Shilicon Corp; Others: 01), Feb. 2, 1996.
Meuris M et al: "The IMEC Clean: A New Concept For Particle And Metal Removed On Si Surfaces", Solid State Technology, US, Cowan Publ. Corp. Washington vol. 38, No. 7, 1995, p. 109-110, 112, 114 XP 000523398, ISSN: 0038-111X, p. 110, L.5-44.
The English Derwent Abstract 1996-404246[41] corresp. to EP 0731495A2 is enclosed.

* cited by examiner

*Primary Examiner*—Yogendra N. Gupta
*Assistant Examiner*—Matt J Song
(74) *Attorney, Agent, or Firm*—Brooks Kushman P.C.

(57) ABSTRACT

A process for the wet chemical treatment of semiconductor wafers, in which the semiconductor wafers are treated with treatment liquids, has the semiconductor wafers firstly treated with an aqueous HF solution, then treated with an aqueous $O_3$ solution and finally treated with water or an aqueous HCl solution, these treatments forming a treatment sequence.

14 Claims, No Drawings

PROCESS FOR THE WET CHEMICAL TREATMENT OF SEMICONDUCTOR WAFERS

BACKGROUND OF THE INVENTION

1. Field of the Invention

The present invention relates to a process for the wet chemical treatment of semiconductor wafers, in which the semiconductor wafers are treated with treatment liquids, in particular a process for the cleaning of silicon semiconductor wafers.

2. The Prior Art

A treatment process of this type has been described, for example, by M. Meuris et al. in *Solid State Technology*, July 1995, p. 109.

SUMMARY OF THE INVENTION

It is an object of the present invention to provide a process by which metallic impurities and particles can be removed particularly effectively from semiconductor wafers.

The above object is achieved according to the present invention by providing a process for the wet chemical treatment of semiconductor wafers, in which the semiconductor wafers are treated with treatment liquids, wherein the semiconductor wafers are firstly treated with an aqueous HF solution, then with an aqueous $O_3$ solution and finally with water or an aqueous HCl solution, these treatments forming a treatment sequence.

It has been found that the object is achieved by this treatment sequence, which does not need to be interrupted by rinsing with water or another treatment liquid and is carried out exclusively at a pH which is lower than pH 7. The treatment according to the invention with the treatment liquids indicated is performed in treatment baths. It is preferable to circulate the treatment liquid, that is to take some of this liquid from the corresponding treatment bath and return it back after having been filtered. This saves on outlay for the required chemicals and for deionized water. The addition of fresh water or other liquids to the treatment baths is to be avoided since, when valves are opened, pressure impulses are created and particles can be introduced into the treatment baths. The treatment according to the invention is therefore different from a rinsing treatment, in which fresh treatment liquid is supplied continuously or at intervals.

The treatments include treating the semiconductor wafers firstly in a bath with an aqueous HF solution, then in a bath with an aqueous $O_3$ solution and finally in a bath with water or an aqueous HCl solution, form a treatment sequence $B_2$. Sequence $B_2$ may be preceded by a treatment $B_1$ of the semiconductor wafers in a bath with an aqueous SC1 solution. An SC1 solution contains $NH_4OH$ and $H_2O_2$ or TMAH (=tetramethylammonium hydroxide) and $H_2O_2$ is preferred. The treatment sequence $B_2$ may also be followed by a treatment $B_3$ of drying the semiconductor wafers. The drying treatment is preferably carried out using the centrifugal, hot water, isopropanol or marangoni principle.

It is particularly preferable to arrange the sequencing of the treatment of the semiconductor wafers according to the term $m*(B_1+B_2)+B_3$, with m being an integer number. The treatment $B_1$ and the treatment sequence $B_2$ are carried out in succession, and this takes place m times, before the drying treatment $B_3$ is performed.

The aqueous HF solution used in the treatment sequence $B_2$ preferably contains HF in a concentration of from 0.001% to 2% by weight and optionally HCl in a concentration of up to 2% by weight and optionally a surfactant. A mixture of alkylbenzenesulfonate and fatty amine polyglycol ethers in a concentration of 0.001% to 2% by weight is particularly preferred as a surfactant additive. The aqueous $O_3$ solution used in the treatment sequence $B_2$ preferably contains $O_3$ in a concentration of from 1 to 30 ppm and optionally HF in a concentration of from 0.0001% to 2% by weight and is optionally exposed to megasonic waves. The liquid used last in the treatment sequence $B_2$ is water or an aqueous HCl solution, which preferably contains HCl in a concentration of from 0.001% to 10% by weight. The liquid may optionally contain $O_3$ and optionally be exposed to megasonic waves. The temperature of the bath is preferably at a temperature of from room temperature to 80° C.

All percents by weight are based upon the total solution weight.

Other objects and features of the present invention will become apparent from the following detailed description considered in connection with the accompanying examples which disclose embodiments of the present invention. It should be understood, however, that the examples are designed for the purpose of illustration only and not as a definition of the limits of the invention.

DETAILED DESCRIPTION OF PREFERRED EMBODIMENTS

The comparison below of an invention example with comparative examples shows the advantageous effect of the present invention.

The table contains the results (3 sigma values) of conventional counts of particles of specific size (LPD=light point defects), which were in each case carried out on 20 polished semiconductor wafers after a wet chemical treatment sequence and drying which was the same for all the semiconductor wafers.

The example (B) comprised the treatment sequence: HF bath, deionized water/ozone bath, HCl bath with megasonic exposure.

COMPARATIVE EXAMPLE 1

(C1) comprised the treatment sequence: HF bath, deionized water/ozone bath, rinsing with deionized water outside the bath.

COMPARATIVE EXAMPLE 2

(C2) comprised the treatment sequence: HF bath, deionized water/ozone bath with subsequent rinsing using deionized water in the bath and megasonic exposure.

|  | Number | | | |
| --- | --- | --- | --- | --- |
| LPD (μM) | >0.3 | >0.2 | >0.16 | >0.12 |
| B | 3 | 7 | 30 | 480 |
| C1 | 4 | 13 | 50 | 550 |
| C2 | 10 | 50 | 140 | 550 |

Accordingly, while a few embodiments of the present invention have been shown and described, it is to be understood that many changes and modifications may be made thereunto without departing from the spirit and scope of the invention as defined in the appended claims.

What is claimed is:

1. A process for the wet chemical treatment of semiconductor wafers with treatment liquids in baths, consisting of the steps of
firstly treating the semiconductor wafers in a bath with an aqueous HF solution containing HF and optionally HCl and optionally a surfactant;
then treating the semiconductor wafers in a bath with an aqueous $O_3$ solution containing $O_3$ and optionally HF; and
then treating the semiconductor wafers in a bath with an aqueous HCl solution containing HCl and optionally $O_3$;
whereby these treatment steps form a treatment sequence $B_2$, which avoids rinsing with water or another treatment liquid and the addition of fresh water or other liquids to the treatment baths.

2. The process as claimed in claim 1,
wherein the treatment sequence $B_2$ is preceded by a treatment $B_1$ of the semiconductor wafers with an aqueous SC-1 solution.

3. The process as claimed in claim 2,
wherein in treatment $B_1$ the aqueous SC-1 solution contains a liquid selected from the group consisting of $NH_4OH$ and $H_2O_2$, and TMAH (=tetramethylammonium hydroxide) and $H_2O_2$.

4. The process as claimed in claim 1,
wherein the treatment sequence $B_2$ is followed by a treatment $B_3$ comprising drying the semiconductor wafers.

5. The process as claimed in claim 4,
wherein the treatment of the semiconductor wafers is sequenced according to the term m* $(B_1+B_2)+B_3$,
m being an integer number and the treatment $B_1$ and the treatment sequence $B_2$ being carried out in succession, and
this taking place m times, before the drying treatment $B_3$ is performed.

6. The process as claimed in claim 4,
wherein the drying treatment is carried out using a step selected from the group consisting of centrifuging, using hot water, using isopropanol, and using marangoni principle.

7. The process as claimed claim 1,
wherein in treatment sequence $B_2$, the aqueous HF solution contains HF in a concentration of from 0.001% to 2% by weight and optionally HCl in a concentration of up to 2% by weight and optionally a surfactant; and
wherein all percents by weight are based upon the total solution weight.

8. The process as claimed in claim 1,
wherein in treatment sequence $B_2$, the aqueous $O_3$ solution contains $O_3$ in a concentration of from 1 ppm to 30 ppm and is optionally exposed to megasonic waves.

9. The process as claimed in claim 1,
wherein the treatment liquid used last in the treatment sequence $B_2$ contains ozone and is optionally exposed to megasonic waves.

10. A process for the wet chemical treatment of semiconductor wafers with treatment liquids in baths, consisting of the steps of
firstly treating the semiconductor wafers in a bath with an aqueous HF solution containing HF and optionally HCl and optionally a surfactant;
then treating the semiconductor wafers in a bath with an aqueous $O_3$ solution containing $O_3$ and optionally HF; and
then treating the semiconductor wafers in a bath with an aqueous HCl solution containing HCl and optionally $O_3$ with exposure to megasonic waves,
whereby these treatment steps form a treatment sequence $B_2$, which avoids rinsing with water or another treatment liquid and the addition of fresh water or other liquids to the treatment baths.

11. A process for the wet chemical treatment of semiconductor wafers with treatment liquids in baths, comprising the steps of
firstly treating the semiconductor wafers in a bath with an aqueous HF solution containing HF and optionally HCl and optionally a surfactant;
then treating the semiconductor wafers in a bath with an aqueous $O_3$ solution containing $O_3$ and optionally HF; and
then treating the semiconductor wafers in a bath with an aqueous HCl solution containing HCl and optionally $O_3$;
whereby these treatment steps form a treatment sequence $B_2$; and
circulating the treatment liquids of said baths by taking a part from each of said baths, filtering and returning the part to the corresponding treatment bath.

12. A process for the wet chemical treatment of semiconductor wafers with treatment liquids in baths, comprising the steps of
firstly treating the semiconductor wafers in a bath with an aqueous HF solution containing HF and optionally HCl and optionally a surfactant;
then treating the semiconductor wafers in a bath with an aqueous $O_3$ solution containing $O_3$ and optionally HF; and
then treating the semiconductor wafers in a bath with an aqueous HCl solution containing HCl and optionally $O_3$ with exposure to megasonic waves;
whereby these treatment steps form a treatment sequence $B_2$; and
circulating the treatment liquids of said baths by taking a part from each of said baths, filtering and returning the part to the corresponding treatment bath.

13. A process for the wet chemical treatment of semiconductor wafers with treatment liquids in baths, comprising the steps of
firstly treating the semiconductor wafers in a bath with an aqueous HF solution containing HF and optionally HCl and optionally a surfactant;
then treating the semiconductor wafers in a bath with an aqueous $O_3$ solution containing $O_3$ and optionally HF; and
then treating the semiconductor wafers in a bath with an aqueous HCl solution containing HCl and optionally $O_3$; and
circulating the treatment liquids of said baths by taking a part from each of said baths, filtering and returning the part to the corresponding treatment bath;
whereby these treatment steps form a treatment sequence $B_2$, which avoids rinsing with water or another treatment liquid and the addition of fresh water or other liquids to the treatment baths.

14. A process for the wet chemical treatment of semiconductor wafers with treatment liquids in baths, comprising the steps of
firstly treating the semiconductor wafers in a bath with an aqueous HF solution containing HF and optionally HCl and optionally a surfactant;
then treating the semiconductor wafers in a bath with an aqueous $O_3$ solution containing $O_3$ and optionally HF; and then treating the semiconductor wafers in a bath with an aqueous HCl solution containing HCl and optionally $O_3$ with exposure to megasonic waves; and circulating the treatment liquids of said baths by taking a part from each of said baths, filtering and returning the part to the corresponding treatment bath;

whereby these treatment steps form a treatment sequence $B_2$, which avoids rinsing with water or another treatment liquid and the addition of fresh water or other liquids to the treatment baths.

* * * * *